United States Patent [19]

Mouret

[11] Patent Number: 5,034,631
[45] Date of Patent: Jul. 23, 1991

[54] TTL COMPATIBLE OUTPUT CIRCUIT WITH A HIGH SWITCHING SPEED

[75] Inventor: Michel Mouret, Jarry, France

[73] Assignee: SGS-Thomson Microelectronics S.A., Gentilly, France

[21] Appl. No.: 484,094

[22] Filed: Feb. 23, 1990

[30] Foreign Application Priority Data

Feb. 24, 1989 [FR] France .................. 89 02859

[51] Int. Cl.⁵ ............... H03K 19/013; H03K 19/088
[52] U.S. Cl. ..................... 307/456; 307/443; 307/300
[58] Field of Search ............ 307/443, 456, 457, 254, 307/300

[56] References Cited

U.S. PATENT DOCUMENTS

| | | | |
|---|---|---|---|
| 4,339,676 | 7/1982 | Ramsey | 307/456 X |
| 4,562,364 | 12/1985 | Tamizawa | 307/456 X |
| 4,661,727 | 4/1987 | Ferris et al. | 307/456 |
| 4,912,344 | 3/1990 | Yin | 307/443 X |
| 4,958,090 | 9/1990 | Jansson | 307/456 |

FOREIGN PATENT DOCUMENTS

| | | | |
|---|---|---|---|
| 55-92040 | 12/1978 | Japan . | |
| 55-060339 | 7/1980 | Japan . | |
| 61-293022 | 6/1985 | Japan . | |
| 61-224727 | 6/1986 | Japan . | |
| 61-90518 | 9/1986 | Japan . | |
| 0224727 | 10/1986 | Japan | 307/456 |
| 0290820 | 12/1986 | Japan | 307/456 |
| 63-128814 | 6/1988 | Japan . | |
| 0057821 | 3/1989 | Japan | 307/456 |

OTHER PUBLICATIONS

Varadarajan, "Antisaturation TTL Circuit", *IBM T.D.B.*, vol. 14, No. 1, Jun. 1971, p. 335.
Wiedmann, "A Novel Saturation Control in TTL Circuits", IEEE J.S.S.C., vol. SC-7, No. 3, 6-1972, pp. 243-250.

*Primary Examiner*—David Hudspeth
*Attorney, Agent, or Firm*—Lowe, Price, LeBlanc and Becker

[57] ABSTRACT

An output circuit compatible with TTL-type circuits, manufactured without Schottky devices comprises an intermediate stage (11) and an output stage (12). In the output stage, a first transistor (Q1) has its collector (C1) connected to the terminal (13) of the supply source through a resistor (R1) and its emitter (E1) connected to the output (S) through a diode (D1). A second transistor (Q2) has its collector (C2) connected to the output terminal (S) and its emitter (E2) connected to the terminal (14) of the supply source. A third transistor (Q3) has its emitter (E3) connected to the base (E2) of the second transistor (Q2) through a resistor (R4), its collector (C3) connected to the terminal (13) of the supply source and its base (B3) connected to the input terminal (A1). The intermediate stage is constituted by an inverter which controls the first transistor (Q1) in phase opposition with respect to the second transistor (Q2).

7 Claims, 3 Drawing Sheets

TTL COMPATIBLE OUTPUT CIRCUIT WITH A HIGH SWITCHING SPEED

BACKGROUND OF THE INVENTION

The invention relates to bipolar output circuits compatible with TTL-type circuits, and more particularly to high speed output circuits without Schottky devices (the latters not being usable in some technological implementations).

The TTL compatible output circuits have to supply either signals higher than 2.4 V, or signals lower than 0.4 V. In the latter case, the output circuit has to stand a current of about 16-24 mA applied to its output terminal.

FIG. 1 shows a conventional bipolar output circuit. It is fed by a supply source, a first terminal 1 of which supplies a positive voltage VCC and the second terminal 2 is grounded. It comprises an input terminal 3 and an output terminal 4. A first NPN output transistor T1 has its collector connected to terminal 1 through a resistor RA and its emitter connected to the output terminal through a diode 5. A second NPN output transistor T2 has its collector connected to the output terminal and its emitter connected to the terminal 2 of the supply source. The collector of an NPN control transistor T3 is connected on the one hand to the base of transistor T1 and on the other hand through a resistor RB to the terminal 1 of the supply source. The emitter of transistor T3 is connected to the base of transistor T2 and is connected, through a resistor RC, to terminal 2 of the supply source. Transistor T3 has its base connected on the one hand to terminal 1 through a resistor RD and on the other hand to input terminal 3 through a diode 6.

Two voltage levels are liable to be applied to the input terminal: a low voltage level (low state) and a high voltage level (high state). When the input is at a low level, diode 6 is forward biased. Transistor T3, as well as transistor T2, are blocked. Transistor T1 is conductive and the output is at a high level. When the input is at a high level, transistors T3 and T2 are conductive and transistor T1 is blocked. The output is at a low level.

The circuit of FIG. 1 satisfactorily operates if the transistors and the diodes represented are of the Schottky type. The switching speed is then very high (about a few nanoseconds). However if, as illustrated, the transistors and diodes are of the conventional bipolar type, two phenomena limit the switching speed.

On the one hand, if some transistors operate in a saturation mode in the circuit, their switching off speed state is reduced.

On the other hand, during the switching on phase of a transistor, the switching speed is reduced due to Miller effect.

When a transistor is in a saturation mode, the fact that current $i_B$ in the base is relatively high, the base voltage being higher than the collector voltage, causes charges to be stored in the transistor base (if $I_C$ is the current in the collector and $\beta$ is the transistor gain, $I_C/i_B << \beta$ in the saturation mode). Thus, in order to avoid the saturation mode, the current in the base is limited when the transistor is conductive, or the voltage drop between the base and the collector is determined so that it is strictly lower than a threshold voltage $V_S$ which is in practice equal to about the voltage $V_{BE}$ existing between the base and the emitter of a transistor in the conductive state.

In order to limit the Miller effect at the switching on, one will limit the voltage gain of the transistors for which the charge of the base-collector capacitor is critical, this charge originating from the current arriving on the base.

In the circuit of FIG. 1, when output 4 is at a low state, each of the two transistors T2 and T3 presents a low voltage drop between collector and emitter. The voltage difference between the base and the collector is roughly equal to the voltage drop $V_{BE}$ between the base and the emitter, which conventionally is about 0.7 V. The voltage drop between the base and the collector is roughly equal to the threshold voltage $V_S$. Transistors T2 and T3 operate in the saturation mode.

Moreover, the charging of the base-collector capacitor of transistor T3 at the switching on is slow due to the presence of resistor RD. Moreover, the voltage gain of transistor T3 is high due to the presence of resistor RB. Therefore, transistor T3 exhibits an important Miller effect at the switching on.

In the prior art, in order to solve this problem, it has been tried to provide for output circuits without high speed switching Schottly devices. For this purpose, efforts have been mainly mode to prevent the pull down transistor (T2) from operating in the saturation mode. This brings a first improvement. However, when considering all the known circuits, it appears they all include, in control stages, some transistors operating in the saturation mode when they are in a conductive state or some transistors having a high voltage gain, for which the charge of the base-collector capacitor is critical and which therefore present an important Miller effect.

SUMMARY OF THE INVENTION

An object of the present invention is to provide for a TTL compatible output circuit having a high switching speed.

To achieve this object, the invention provides for a circuit wherein there is no transistor operating in the saturation mode or presenting an important Miller effect.

More particularly, the invention provides for an output circuit compatible with the TTL-type circuits, having an output terminal and an input terminal, manufactured without Schottky devices and comprising an intermediate state and an output stage connected to a supply source, the first terminal of which delivers a voltage higher than the voltage of the second terminal. The output stage comprises:
- a first transistor, the collector and base of which are connected to the first terminal of the supply source through a first resistor and a second resistor, respectively,
- a first diode, the anode of which is connected to the emitter of the first transistor and the cathode is connected to the output terminal,
- a second transistor, the collector of which is connected to the output terminal, the emitter of which is connected to the second terminal of the supply source and the base is connected to a third resistor, the free terminal of which is connected to the second terminal of the supply source,
- a third transistor, the emitter of which is connected to the base of the second transistor through a fourth resistor, the collector of which is connected to the first terminal of the supply source and the base is connected to the input terminal, a second diode, the anode of which is connected to the input terminal and the cathode is connected to the emitter for the first transistor.

The intermediate stage is comprised of an inverter which controls the first transistor in phase opposition with respect to the control of the second transistor.

According to an embodiment of the invention, the inverter comprises:

a fourth transistor, the collector of which is connected to the first terminal of the supply source, the emitter of which is connected through a fifth resistor to the second terminal of the supply source and the base is connected to the input terminal, a fifth transistor, the base of which is connected to the emitter of the fourth transistor, the emitter of which is connected to the second terminal of the supply source and the collector is connected to the base of the first transistor, and a third diode, the anode of which is connected to the input terminal and the cathode is connected to the collector of the fifth transistor.

BRIEF DISCLOSURE OF THE INVENTION

The foregoing and other objects, features and advantages of the invention will be apparent from the following detailed description of a preferred embodiment as illustrated in the accompanying drawings, wherein:

FIG. 1, already described, shows a conventional output circuit;

DESCRIPTION OF A PREFERRED EMBODIMENT

Figure 1:
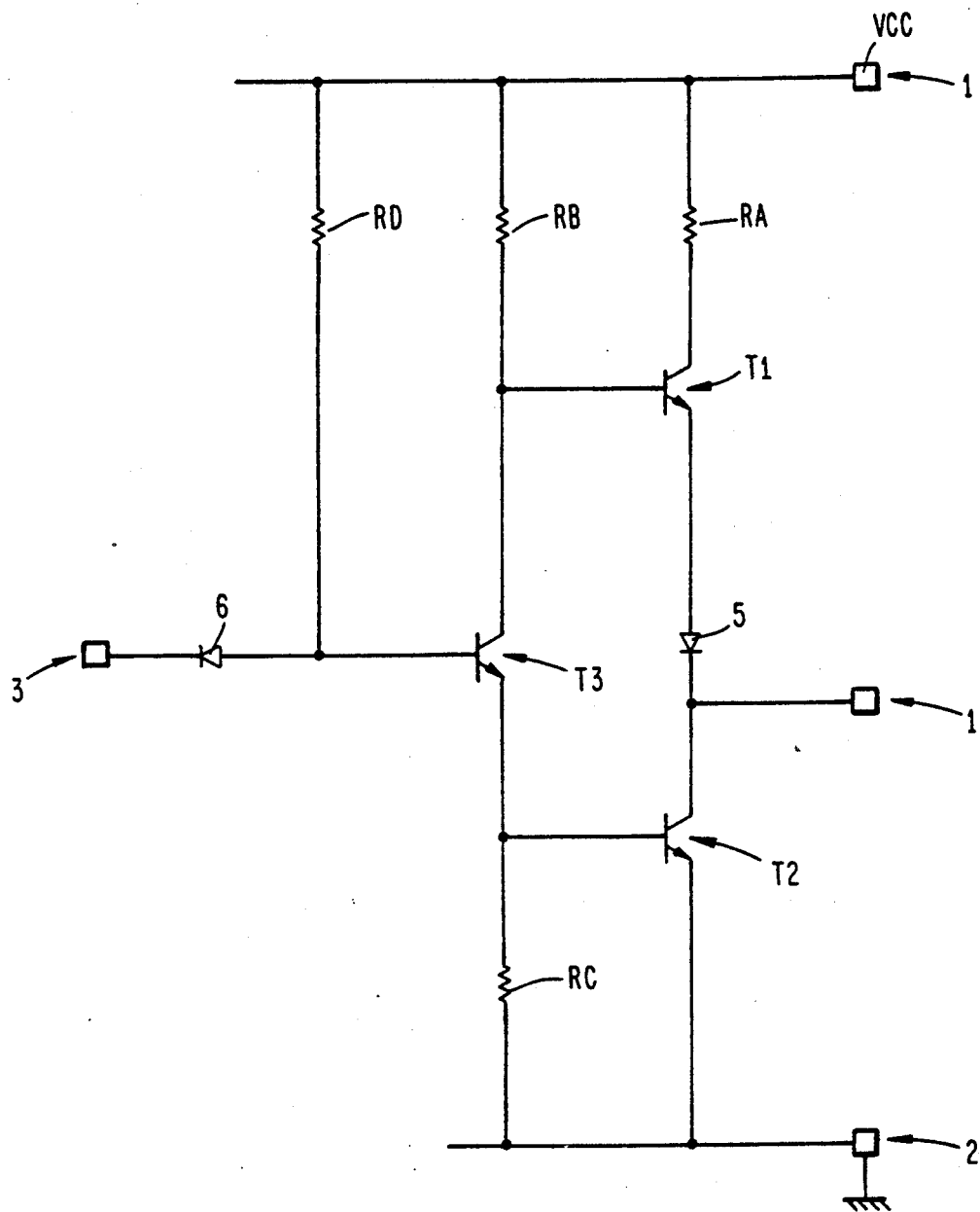
Figure 2:
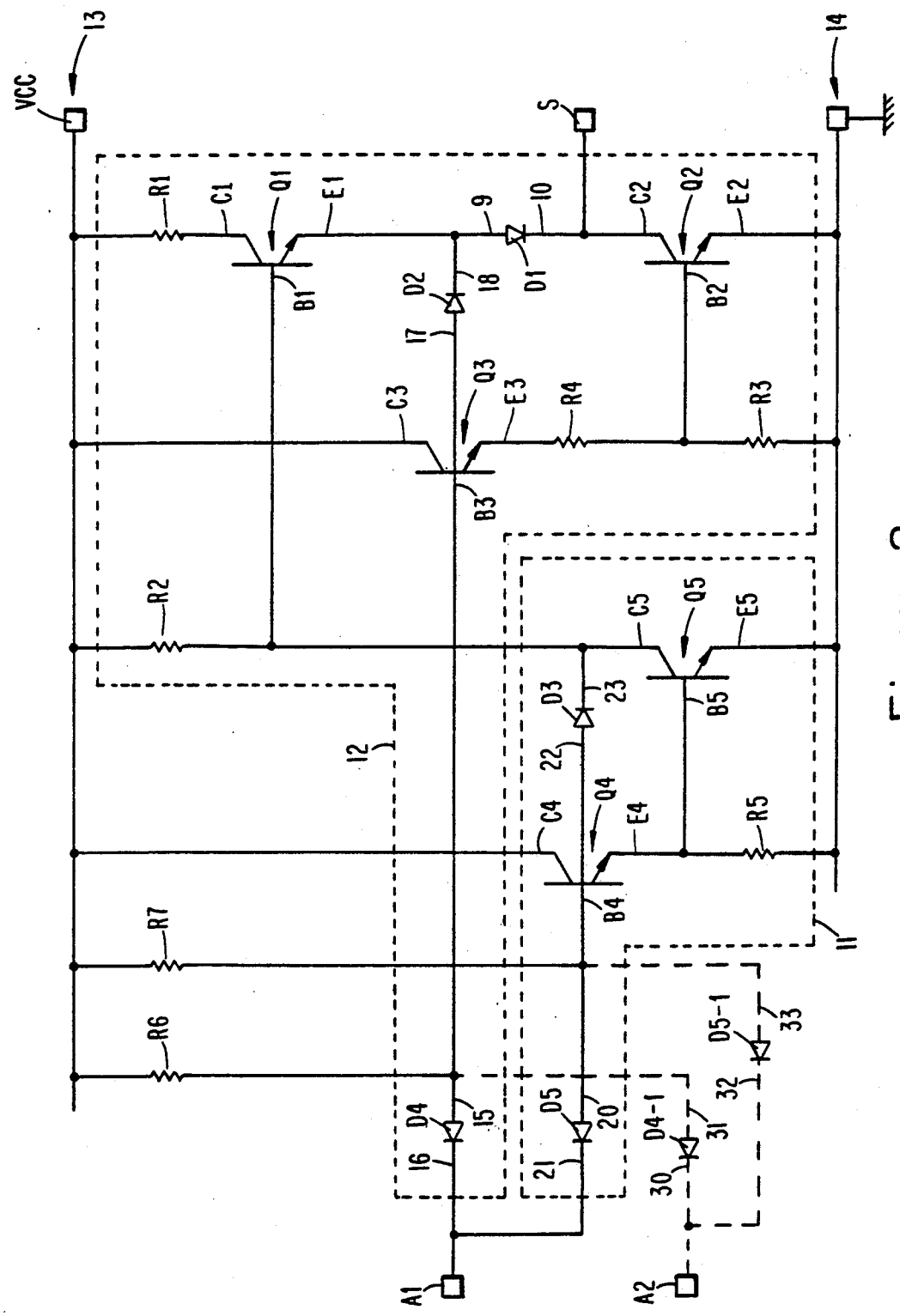
FIG. 2 shows an output circuit according to the invention.

FIG. 2 shows a TTL compatible output bipolar circuit with a high switching speed according to the invention. The circuit comprises an intermediate stage 11 and an output stage 12 connected to a supply source, the first terminal 13 of which supplies a positive VCC voltage and the second terminal 14 of which is grounded. The circuit also has an input terminal A1 and an output terminal S.

The output stage comprises a first transistor Q1, the collector C1 and base B1 of which are connected to terminal 13 of the supply source through a first resistor R1 and a second resistor R2, respectively. Emitter E1 of transistor Q1 is connected to the anode 9 of a diode D1, the cathode 10 of which is connected to the collector C2 of a second transistor Q2 and to the output terminal S of the circuit. Transistor Q2 has its emitter E2 grounded and its base B2 connected on the one hand, through a resistor R3, to the ground and on the other hand, through a resistor R4, to the emitter E3 of a third transistor Q3, the collector C3 of which is connected to the terminal 13 of the supply source. Base B3 of transistor Q3 is connected on the one hand to the anode 15 of a diode D4, the cathode 16 of which is connected to the input terminal A1 and on the other hand to the anode 17 of a diode D2, the cathode 18 of which is connected to the emitter E1 of transistor Q1.

The intermediate stage 11 is constituted by an inverter comprising a transistor Q4, the collector C4 of which is connected to the terminal 13 of the supply source and the emitter E4 is grounded through a resistor R5. Base B4 of transistor Q4 is connected on the one hand to the anode 20 of a diode D5, the cathode 21 of which is connected to the input terminal A1 and on the other hand to the anode 22 of a diode D3, the cathode 23 of which is connected to the collector C5 of a transistor Q5. Transistor Q5 has its base B5 connected to the emitter E4 of transistor Q4 and its emitter E5 grounded.

A resistor R6 is connected between terminal 13 of the supply source and anode 15 of diode D4. A resistor R7 is connected between terminal 13 of the supply source and anode 20 of diode D5.

Operation of the circuit when the input is low

When input A1 is at a low state, diode D4 is forward biased. The voltage at base B3 of transistor Q3 is low and the transistor is blocked. The voltage at base B2 of transistor Q2 is then also low and transistor Q2 is also blocked. Moreover, diode D5 is forward biased and transistors Q4 and Q5 are blocked. Since transistor Q5 is blocked, diode D3 being reverse biased, the voltage on the base of transistor Q1 is high and transistor Q1 is conductive. Diode D2 is reverse biased and diode D1 is forward biased. Output S is at a high state.

The current flowing out through output S, when the latter is at a high level, is low, for example 400 μA at the most. Resistor R1 is then also very low, for example equal to a value of 50 ohms. The voltage drop across its terminals is then 20 mV. If the gain value of the transistor is 100, a 4 μA current flows in resistor R2. In case R2 has a value of 1000 ohms, the voltage drop across its terminals is 4 mV. The voltage drop between the base and the collector of the transistor Q1 is equal to 16 mV, which is much too low for causing transistor Q1 to operate in saturation mode.

Resistors R6 and R7 are high value resistors of a few tens kiloohms for especially limiting the consumption of the output circuit and the charge current of the control circuit connected to input A1. The charge of the base-collector capacitors of transistors Q3 and Q4 is carried out through resistors R6 and R7, respectively. The charge currents of the capacitors are not high and the charge of the capacitors is critical for those two transistors. In this circuit, there is no charge connected to their collectors. Their voltage gains are therefore null and they do not exhibit any Miller effect at the switching on, that is, when input A1 switches from low state to high state.

Transistor Q5 has its base connected to the emitter of transistor Q4. Transistor Q4 has a low output impedance in comparison with transistor Q5. Additionally, when transistor Q4 is set to conductive state, it is fed by a high transitory current before being stabilized at a much lower equilibrium value (that is, once transistor Q5 and diode D3 have been set to permanent conductive mode). The charge current of the base-collector capacitor of transistor Q5 when being set to conductive state is therefore very high and the capacitor charge is not critical. Moreover, transistor Q5 has its collector connected to resistor R2 with a lower value of about a few thousands ohms. Transistor Q5 does not present substantial Miller effect at the switching on.

Transistor Q2 has its base connected to the emitter of transistor Q3 through resistor R4. The value of the resistor is about a few hundreds ohms. Transistor Q3 has a low output impedance. When set to conductive state, it is fed by a high transitory mode current. The charge current of the base-collector capacitor of transistor Q2 is high and the capacitor charge is not critical.

Additionally, the transistor receives, when the output is at a low state, fairly high currents of about 20 mA, which corresponds to a fairly low charge at the collector. Transistor Q2 does not present a substantial Miller effect at the switching on.

Operation of the circuit when the input is high

When input A1 is at a high stage, diode D5 is reverse biased. The voltage at the base of transistor Q4 is high and the transistor is conductive. The voltage at the base of transistor Q5 is therefore also high and transistor Q5 is conductive. Additionally, diode D3 is forward biased and transistor Q1 is blocked.

If it is admitted that all the transistors, when they are in the conductive state, exhibit the same voltage drop $V_{BE}$ between the base and the emitter, and if one considers that the voltage drop across the forward biased diodes is substantially equal to the voltage drop $V_{BE}$, the voltage at the base of transistor Q5 is equal to $V_{BE}$, and the voltage at the base of transistor Q45 is equal to $2V_{BE}$. The voltage at cathode 23 of diode D3, that is, at collector C5 of transistor Q5, is roughly equal to $V_{BE}$.

Transistor Q2 being conductive, the voltage at its base B2 is equal to $V_{BE}$. A current $I_{E3}$ flows through resistor R4, the voltage at emitter E3 of transistor Q3 is equal to $V_{BE}+Rr \times I_{E3}$. The voltage at cathode 18 of diode D2 is equal to $V_{BE}+R4 \times I_{E3}$. The voltage at collector C2 of transistor Q2 is then substantially equal to $R4 \times I_{E3}$. The values of R3 and R4 are such that the voltage at the collector of transistor Q2, that is, at the output S, is equal to some hundreds millivolts, for example 300 mV.

This voltage is sufficient for preventing transistor Q2 from operating in saturation mode. Indeed, the voltage drop between the base and the collector is then about $700-300=400$ mV, which is lower than the threshold voltage VS.

It has been seen that the voltage at the base of transistor Q3 when it is conductive is $2V_{BE}+R4 \times I_{E3}$. The value of resistor R4 is a few hundreds ohms, for example 300 ohms and current $I_{E3}$ is about 1 mA. The base voltage of transistor Q3 is therefore about 1.7 V. The voltage at the collector of transistor Q3, which is the supply voltage VCC equal for example to 5 V, is much higher than the voltage at the base; so, transistor Q3 does not operate in saturation mode.

Figure 3:
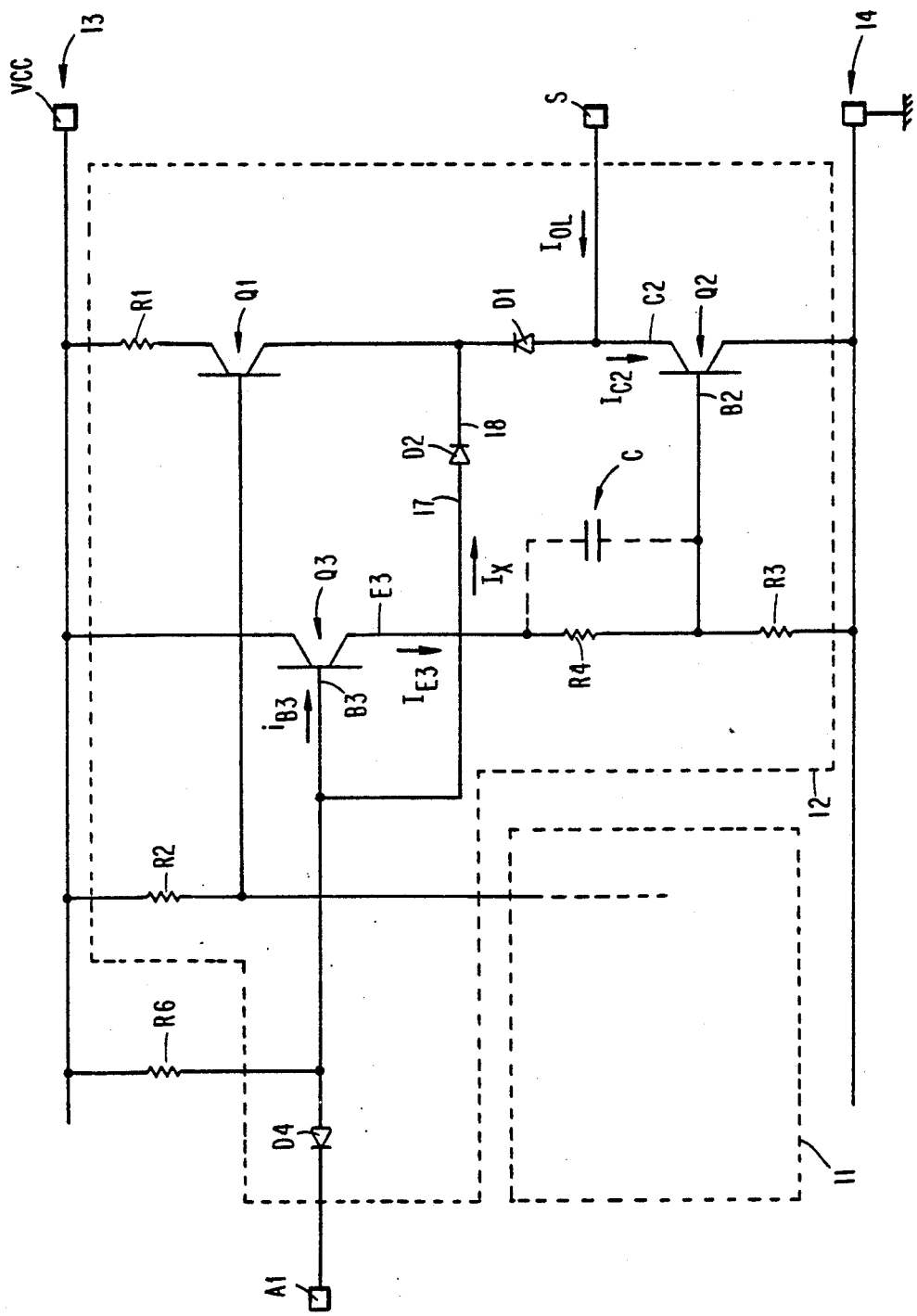
FIG. 3 shows a portion of the output circuit of FIG. 2.

FIG. 3 shows the output stage 12 of FIG. 2, drawn in a different way with respect to FIG. 2 as regards the connection between anode 17 of diode D2 and base B3 of transistor Q3. The output stage is the same as in FIGS. 2 and 3, but the drawing of FIG. 3 permits to better understand the operation of input A1 when it is at high level.

Thus, when input A1 is at high level, diode D4 is reverse biased. Transistor Q3 is conductive. Diodes D2 and D1 are forward biased. Current $i_{B3}$ at the base of transistor Q3 depends upon the intensity of current $I_{OL}$ applied at output S. INdeed, the relation between currents $i_{B3}$ and $I_{OL}$ is established as follows. If $I_{E3}$ is the current in the emitter of transistor Q3 and $\beta_3$ is the gain of transistor Q3, current $i_{B3}$ is defined by $i_{B3}+I_{E3}/(\beta_3+1)$. On the other hand, if $i_{B2}$ is the current in the base of transistor Q2, current $I_{E3}$ is defined by $I_{E3}=i_{B2}+V_{BE}/R3$. *Therefore one obtains the following relation:*

$$i_{B3}=i_{B2}/(\beta_3+1)+V_{BE}/(\beta_3+1)R3 \qquad (1)$$

Current $I_{C2}$ in the collector of transistor Q2 is the sum of current $I_{OL}$ and of current $I_X$ flowing through diode D1. If $\beta_2$ is the transistor gain, one obtains:

$$i_{B2}=(I_X+I_{OL})/\beta_2$$

Since transistor Q1 is blocked, diode D2 is also fed by current $I_X$. As the base of transistor Q3 is connected to terminal 13 of the supply source through resistor R6 and diode D4 is reverse biased, the sum $I=i_{B3}+I_X$ is constant. Current $i_{B2}$ is thus defined by:

$$i_{B2}=(I-i_{B3}+I_{OL})/\beta_2$$

The current in the base of transistor Q3 is thus:

$$i_{B3} = \frac{I}{\beta_2(\beta_3 + 1)} - \frac{i_{B3}}{\beta_2(\beta_3 + 1)} + \frac{I_{OL}}{\beta_2(\beta_3 + 1)} + \frac{V_{BE}}{(\beta_3 + 1)R3}$$

Therefore one obtains:

$$i_{B3}\left(1 + \frac{1}{\beta_2(\beta_3 + 1)}\right) = \frac{I_{OL}}{\beta_2(\beta_3 + 1)} + \frac{1}{\beta_2(\beta_3 + 1)} + \frac{V_{BE}}{(\beta_3 + 1)R3}$$

Currents $i_{B3}$ and $I_{OL}$ are therefore associated to a relation of the type $i_{B3}=MI_{OL}+P$ where M and P are constants. Since M is a positive constant, when current $I_{OL}$ applied at output S increases, current $i_{B3}$ also increases. According to relation (1), current $i_{B2}$ increases, causing an increase in current $I_{C2}$ which permits to absorb the increase of current $I_{OL}$.

It has been seen hereinabove that the base voltage of transistor Q4 when it is conductive is $2V_{BE}$. The voltage at the collector of the transistor, which is the supply voltage VCC, is fairly higher than the voltage at the base; so, transistor Q4 does not operate in the saturation mode.

It has also been seen that the voltage at collector C5 of transistor Q5 is roughly equal to $V_{BE}$ when the transistor is conductive. The voltage drop between the base and the collector is almost null and transistor Q5 does not operate in saturation mode.

Resistor R2 has a low value, of about a few thousands ohms. When input A1 switches from high state to low state, the base-collector capacitor of transistor Q1 is charged with a high charge current and the capacitor charge is not critical. Additionally, resistor R1 has a very low value (about 50 ohms). The voltage gain of transistor Q1 is limited. Transistor Q1 presents a very low Miller effect at the switching on.

It has then been established that, in each of the circuit states, none of the conductive transistors operates in saturation mode and none of the blocked transistors presents an important Miller effect at the switching on. The switching speed of the circuit is therefore liable to be high (about one to two nanoseconds).

It will be noted that the circuit according to the invention can be considered as being constituted by two inverter stages. Up to now, it has been conventionally assumed that, in such a case, each of the two inverters had to be TTL compatible. In the circuit of FIG. 2, the output of the inverter constituting the intermediate stage 11 is formed by the collector C5 of transistor Q5. It has been seen that the voltage at the collector of transistor Q5 is substantially equal to $V_{BE}$ when the transistor is conductive, which permits to avoid having it operating in saturation mode. The output voltage of the inverter is then higher than the minimum compatibility voltage of the TTL circuits (0.4 V), which differentiates from the above-mentioned preconception generally admitted in the prior art.

According to an aspect of the invention, the emitter of transistor Q3 is grounded through two resistors R4 and R3 while the emitter of transistor Q4 is grounded through a resistor R5 only. The presence of resistor R4 causes transistor Q3 to be conductive after transistor Q4 during the transition phase from low level to high level at input A1. This presents the advantages to switch on transistor Q2 after transistor Q1 is switched off, instead of having both transistors simultaneously switched. Similarly, during the transition phase from high level to low level at the input, transistor Q2 is switched off before transistor Q1 is switched on. Thus, transistor Q2 does not consume any current from transistor Q1 and the circuit consumption is reduced during transitory modes.

According to a first variant, the size of transistors Q3, Q4 and Q5 is such that the base-emitter voltages of transistors Q4 and Q5 at the conductive state are lower than the base-emitter voltage of transistor Q3 at the conductive stage. Indeed, if the size of the bipolar transistor emitter is increased, the base-emitter voltage $V_{BE}$ of the transistor at the conductive state decreases, and if the size of the emitter is reduced, voltage $V_{BE}$ increases. Thus, one increases the shifting effect as a function of time, initially caused by the presence of resistor R4, between the switching phases of transistors Q1 and Q2, (the size of transistor Q2 is set as a function of the intensity of the current supplied at the output S). It would also be possible to adapt the size of diodes D1, D2 and D3. The modification in the size of the transistors and diodes applies more particularly in case control signals on input A1 have a long dropping or rising time.

According to a second variant, the circuit is liable to include additional input terminals. A second input A2 is for example shown in FIG. 2. The input A2 is connected to cathode 30 of a diode D4-1, the anode 31 of which is connected to anode 15 of diode D4. Input A2 is also connected to cathode 32 of a diode D5-1, the anode 33 of which is connected to anode 20 of diode D5.

According to a third variant, a capacitor C is added at the terminals of resistor R4 (drawn in dotted lines in FIG. 3). When input A1 is switched from low state to high state, current $I_{E3}$ in the emitter of transistor Q3 is distributed in resistor R4 and in capacitor C. In transitory mode, a charged current $\Delta i = C\Delta V/\Delta t$ flows in capacitor C. This current is added to the current flowing through resistor R4. Thus, due to the presence of capacitor C, the current in the base of transistor Q2 is higher in transitory mode. Transistor Q2 can absorb the current received at output S more quickly.

I claim:

1. An output circuit compatible with TTL-type circuits, having an output terminal (S) and an input terminal (A1), manufactured without Schottky devices, comprising an intermediate stage (11) and an output stage (12) connected to a supply source, the first terminal (13) of which supplies a voltage higher than the voltage of its second terminal (14), wherein the output stage comprises:
   a first transistor (Q1), the collector (C1) and base (B1) of which are connected to the first terminal of the supply source through a first resistor (R1) and a second resistor (R2), respectively,
   a first diode (D1), the anode (9) of which is connected to the emitter (E1) of the first transistor and the cathode (10) is connected to the output terminal,
   a second transistor (Q2), the collector (C2) of which is connected to the output terminal, the emitter (E2) of which is connected to the second terminal of the supply source and the base (B2) is connected to a third resistor (R3), the free terminal of which is connected to the second terminal of the supply source,
   a third transistor (Q3), the emitter (E) of which is connected to the base of the second transistor through a fourth resistor (R4), the collector (C3) of which is connected to the first terminal of the supply source and the base is connected to the input terminal,
   a second diode (D2), the anode (17) of which is connected to the input terminal and the cathode (18) is connected to the emitter of the first transistor,
and wherein the intermediate stage is comprised of an inverter which controls the first transistor in phase opposition with respect to the control of the second transistor.

2. An output circuit according to claim 1 wherein the output voltage of the inverter is always higher than the minimum compatibility voltage of TTL circuits.

3. An output circuit according to claim 1 wherein the inverter comprises:
   a fourth transistor (Q4), the collector (C4) of which is connected to the first terminal (13) of the supply source, the emitter (E4) of which is connected through a fifth resistor (R5) to the second terminal (14) of the supply source and the base (B4) is connected to the input terminal (A1),
   a fifth transistor (Q5), the base (B5) of which is connected to the emitter of the fourth transistor, the emitter (E5) of which is connected to the second terminal of the supply source and the collector (C5) is connected to the base (B1) of the first transistor (Q1), and
   a third diode (D3), the anode (22) of which is connected to the input terminal and the cathode (23) is connected to the collector of the fifth transistor.

4. An output circuit according to claim 3 wherein the output stage (12) further comprises a fourth diode (D4), the anode (15) of which is connected to the base (B3) of the third transistor (Q3) and the cathode (16) is connected to the input terminal (A1) and wherein the inverter further comprises a fifth diode (D5), the anode (20) of which is connected to the base (B4) of the fourth transistor (Q4) and the cathode (21) is connected to the input terminal (A1).

5. An output circuit according to claim 4 comprising at least a first input terminal (A1) and a second input terminal (A2), the second input terminal (A2) being connected on the one hand to the cathode (30) of a sixth diode (D4−1), the anode (31) of which is connected to the anode (15) of the fourth diode (D4) and on the other hand to the cathode (32) of a seventh diode (D5−1), the anode (33) of which is connected to the anode (20) of the fifth diode (D5).

6. An output circuit according to claim 1 wherein a capacitor (C) is added across the terminals of the fourth resistor (R4).

7. An output circuit according to claim 3 wherein the size of the third, fourth and fifth transistors (Q3, Q4, Q5) is such that the base-emitter voltages of the fourth and fifth transistors (Q4, Q5) in the conductive state are lower than the base-emitter voltage of the third transistor (Q3) in the conductive stage.

* * * * *